United States Patent
Fukuda

(10) Patent No.: US 6,723,652 B1
(45) Date of Patent: Apr. 20, 2004

(54) DRY ETCHING METHOD AND METHOD OF MANUFACTURING SEMICONDUCTOR APPARATUS

(75) Inventor: Seiichi Fukuda, Kanagawa (JP)

(73) Assignee: Sony Corporation (JP)

( * ) Notice: Subject to any disclaimer, the term of this patent is extended or adjusted under 35 U.S.C. 154(b) by 0 days.

(21) Appl. No.: 09/512,336

(22) Filed: Feb. 24, 2000

(30) Foreign Application Priority Data

Feb. 25, 1999 (JP) ............................................ P11-048638

(51) Int. Cl.⁷ ............................................ H01L 21/302
(52) U.S. Cl. ........................................ 438/714; 438/720
(58) Field of Search ........................... 438/682, 683, 438/706, 714, 719, 720, 721, 722, 723, 738, 743; 216/2

(56) References Cited

U.S. PATENT DOCUMENTS

| 5,024,722 | A | * | 6/1991 | Cathey, Jr. ............... 438/695 |
| 5,164,330 | A | * | 11/1992 | Davis et al. ............... 437/192 |
| 5,846,886 | A | * | 12/1998 | Hattori et al. ............. 438/740 |
| 6,100,193 | A | * | 8/2000 | Suehiro et al. ............ 438/685 |
| 6,146,542 | A | * | 11/2000 | Ha et al. ................... 216/2 |
| 6,296,780 | B1 | * | 10/2001 | Yan et al. .................. 216/67 |

* cited by examiner

Primary Examiner—Kin-Chan Chen
(74) Attorney, Agent, or Firm—Rader, Fishman & Grauer PLLC; Ronald P. Kananen

(57) ABSTRACT

A dry etching method and a method of manufacturing a semiconductor apparatus are disclosed with which satisfactory shape controllability can be obtained and a gate electrode formed by laminating tungsten can be formed without any breakage of a gate insulating film. A polysilicon film, a reaction barrier film made of tungsten nitride, a tungsten film and an offset film made of silicon nitride are sequentially formed on a gate insulating film. Then, a photoresist is used as a mask to etch the tungsten film. The etching process is performed by mixed gas of fluorine gas, chlorine, oxygen and nitrogen.

4 Claims, 6 Drawing Sheets

PRODUCTS OF REACTION ALLOWED TO ADHERE TO SURFACE OF FILM WHICH MUST BE ETCHED

FILM 1 WHICH MUST BE ETCHED

FILM 2 WHICH MUST BE ETCHED

US 6,723,652 B1

DRY ETCHING METHOD AND METHOD OF MANUFACTURING SEMICONDUCTOR APPARATUS

BACKGROUND OF THE INVENTION

1. Field of the Invention

The present invention relates to a method of dry-etching tungsten and a method of manufacturing a semiconductor apparatus which incorporates a gate electrode made of tungsten.

2. Description of the Related Art

Hitherto, polysilicon has widely been used as a material of a gate electrode of a semiconductor apparatus, such as a MOSFET. Since the degree of integration on the semiconductor apparatus and operation speed have been raised in recent years, polycide gates each having a two-layer structure constituted by a metal silicide film and a polysilicon film have been employed. Also self-align silicide gates have been employed which are formed by causing a metal film made of titanium or cobalt and formed on a polysilicon film and a polysilicon film to react with each other.

Pieces of semiconductor apparatus, such as MOSFET, in a generation incorporating a gate, the length of which is 0.13 $\mu$m, or later are required to have a gate electrode exhibiting low resistance.

As gate electrodes each having resistance lower than that of the polycide gate and that of a selfalign silicide gate, polymetal gates having a laminate structure constituted by polysilicon, a reaction barrier and tungsten have attracted attention in recent years. Tungsten has specific resistance which is lower than that of tungsten silicide, which has been widely used, by one order. Therefore, use of tungsten as the material of the gate electrode enables time required to transmit a signal in the semiconductor apparatus to considerably be shortened. Hence it follows that the degree of integration and operation speed of the semiconductor apparatus can be raised.

Also research and development of dry etching which is a main technique for finely machining the polymetal gate have been performed from the above-mentioned technical viewpoint.

At present, use of mixed gas of chlorine ($Cl_2$) and sulphur hexafluoride ($SF_6$) is investigated as a gas for dry-etching tungsten because the mixed gas is time-tried gas and the gas exhibits easy handling. Sulphur hexauoride is decomposed in a plasma to generate fluorine radicals and fluorine ions in large quantities. Therefore, use of sulphur hexafluoride in a dry etching process causes a reaction $W + 6F \rightarrow WF_6 \uparrow$ to occur. Thus, tungsten can quickly be etched.

In a period in which dry etching is performed, accumulation of reaction products, reactions of etching seeds and desorption of the etching seeds are, from a microscopic viewpoint, quickly repeated in the surface of the film which must be etched. When the etching process is performed at relatively low speed, the surface of the film, which must be etched, has small number of asperities from a microscopic viewpoint. That is, the surface is flattened, as shown in FIG. 1. When the etching process is performed at relatively high speed, the surface of the film, which must be etched, has great asperities from a microscopic viewpoint, that is, the surface is roughened, as shown in FIG. 2.

Higher-order fluorine gas, such as sulphur hexafluoride, generates fluorine in a large quantity. Therefore, use of sulphur hexafluoride to serve as the gas for etching tungsten raises the etching rate of tungsten. Simple rise in the etching rate does not raise critical problem from a viewpoint of etching tungsten. When a thin film made of materials which do not have satisfactory selectivity with tungsten and etching is formed below the tungsten, asperities formed on the surface owing to the process for dry-etching tungsten exerts an adverse influence on the actions of the materials of the lower layer. The pieces of semiconductor apparatus, such as the MOSFET, in the generation having the length of 0.13 $\mu$m, or later have the structure that the thickness of the gate insulating film is several nm order or smaller. Therefore, there is apprehension that the gate insulating film is broken because asperities formed during etching of tungsten reach the gate insulating film if the degree of the asperities is too large.

Ions which are involved in the etching reaction can be controlled by controlling the width of distribution of incident particles in the outermost surface of the substrate with a bias applied to the electrode provided for the substrate. Since radicals which are involved in the etching reaction are not charged particles, the width of distribution of incident particles in the outermost surface of the substrate cannot easily be controlled. When etching gas containing radicals in a relatively small quantity with respect to ions is employed, the etching rate in a region in which hairlines are formed densely and that in a region in which hairlines are isolated from one another are substantially the same, as shown in FIG. 3. When etching gas containing radicals in a relatively large quantity with respect to ions is employed, a microloading effect exerts an adverse influence. Thus, the etching rate is reduced in the region in which the hairlines are formed densely and the etching rate is raised in the region in which hairlines are isolated from one another, as shown in FIG. 4.

In general, fluorine requires a long time from generation of fluorine radicals to the demise of the same in a plasma. Therefore, the quantity of generated fluorine radicals is enlarged in a case of gas, such as sulphur hexafluoride, containing fluorine in a large quantity in the gas molecule. When the higher-order fluorine gas, such as sulphur hexafluoride, is employed as the gas for dry-etching tungsten, the quantity of radicals in the plasma is enlarged relatively. As a result, the difference in the mask pattern in the same chip inhibits realization of a uniform etching rate. Hence it follows that satisfactory shape controllability cannot be obtained.

SUMMARY OF THE INVENTION

In view of the foregoing, an object of a present invention is to provide a method of dry-etching tungsten with which satisfactory shape controllability can be obtained by flattening the etched surface.

Another object of the present invention is to provide a method of manufacturing a semiconductor apparatus with which satisfactory shape controllability can be obtained and which is capable of forming a gate electrode constituted by laminating tungsten without any breakage of a gate insulating film.

According to one aspect of the present invention, there is provided a dry etching method comprising the step of dry-etching tungsten with mixed gas containing fluorine gas and chlorine or hydrogen bromide, oxygen and nitrogen.

According to another aspect of the present invention, there is provided a method of manufacturing a semiconductor apparatus comprising the steps of: laminating upwards a polycrystal silicon film or an amorphous silicon film, a tungsten nitride film or a titanium nitride film and a tungsten film on a silicon substrate; and dry-etching the tungsten nitride film or the titanium nitride film and the tungsten film with mixed gas containing fluorine gas and chlorine or hydrogen bromide, oxygen and nitrogen so that a gate electrode is formed.

The dry etching method according to the present invention is arranged to dry-etch tungsten with the mixed gas and form dry-etched tungsten into a predetermined shape.

The method of manufacturing a semiconductor apparatus according to the present invention has the steps of sequentially and upwards forming either of the polycrystal silicon film or the amorphous silicon film and forming the tungsten nitride film or the titanium nitride film so that a tungsten film is formed. Then, the method of manufacturing a semiconductor apparatus according to the present invention has the step of dry-etching the tungsten nitride film or the titanium nitride film and the tungsten film with the mixed gas so that a gate electrode is formed. Note that the tungsten nitride film and the titanium nitride film are formed between the polycrystal silicon film or the amorphous silicon film and the tungsten film to serve as a barrier layer. Therefore, the thickness of each the tungsten nitride film and the titanium nitride film can be reduced with respect to the tungsten film.

The mixed gas contains the fluorine gas, gas of either of chlorine or hydrogen. bromide, oxygen and nitrogen.

The functions of the gases contained in the mixed gas will now be described.

The fluorine gas is, in a plasma, decomposed into fluorine radicals and fluorine ions which are combined with tungsten to enhance etching.

The fluorine gas according to the present invention has a structure that the ratio of fluorine atoms with respect to elements of the gas molecule except for fluorine is four or less. When the composition of the fluorine molecule is $M_xF_y$, fluorine gas having a ratio Y/X of four or less is employed, where M is an element except for fluorine atom and F is fluorine. Specifically, fluorine gas is employed which has a structure that the total number of fluorine atoms in elements which constitute the gas molecule, such as $CF_4$, $CHF_3$, $CH_2F_2$ or $CHF_3$, is four or less. The fluorine gas containing fluorine atoms at a ratio of four or less realizes an etching rate which is slower than that realized by higher-order fluorine gas, such as sulphur hexafluoride. Therefore, a practical etching rate with respect to a tungsten film can be realized. The fluorine gas containing fluorine atoms at the ratio of four or less generates fluorine. radicals in a quantity which is relatively smaller than that of fluorine ions. Therefore, the influence of the microloading effect can be reduced.

The foregoing mixed gas contains either of the chlorine gas or bromine gas. Chlorine gas forms oxy halide ($WO_xCl_y$) of tungsten in association with oxygen to enhance etching of tungsten. Similarly, bromine forms oxy halide ($WO_xBr_y$) in association with oxygen to enhance etching of tungsten.

Nitrogen nitrides side walls of the tungsten film and the like to form tungsten nitride to prevent progress of etching in a region in which hairlines are isolated from one another. Therefore, nitrogen makes the etching rate in a region in which hairlines are formed densely and that in a region in which Hairlines are isolated from one another to be uniform.

Since the mixed gas contains the fluorine gas, the gas of chlorine or hydrogen bromide, oxygen and nitrogen, the microloading effect can be prevented. Moreover, tungsten can be etched at a practical rate.

Other objects, features and advantages of the invention will be evident from the following detailed description of the preferred embodiments described in conjunction with the attached drawings.

DESCRIPTION OF THE PREFERRED EMBODIMENTS

A process for manufacturing a MOS transistor according to an embodiment of the present invention and incorporating a gale electrode made of tungsten will now be described with reference to the drawings.

Figure 1:
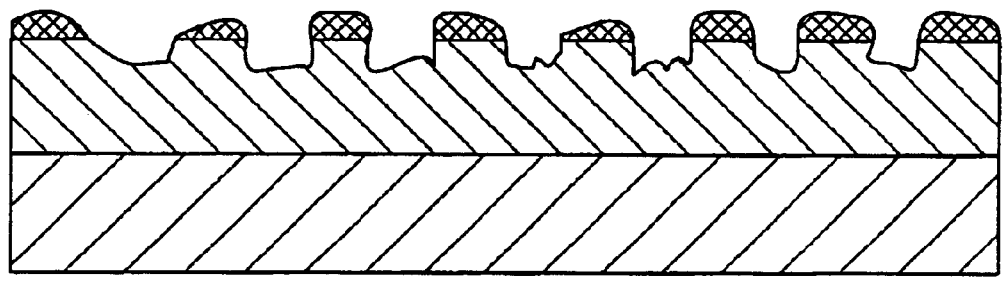
FIG. 1 is a schematic cross sectional view showing a state of a film, which must etched, when etching is performed at a relatively low rate.
Figure 1:
Figure 1:
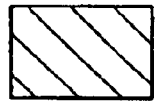
Figure 1:
Figure 2:
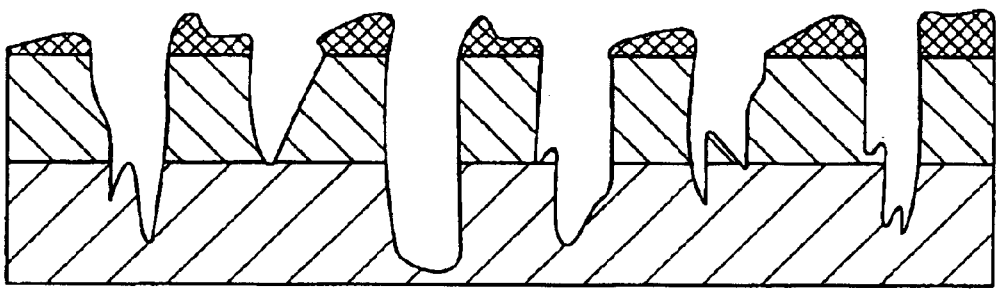
FIG. 2 is a schematic cross sectional view showing a state of a film, which must etched, when etching is performed at a relatively high rate.
Figure 3:
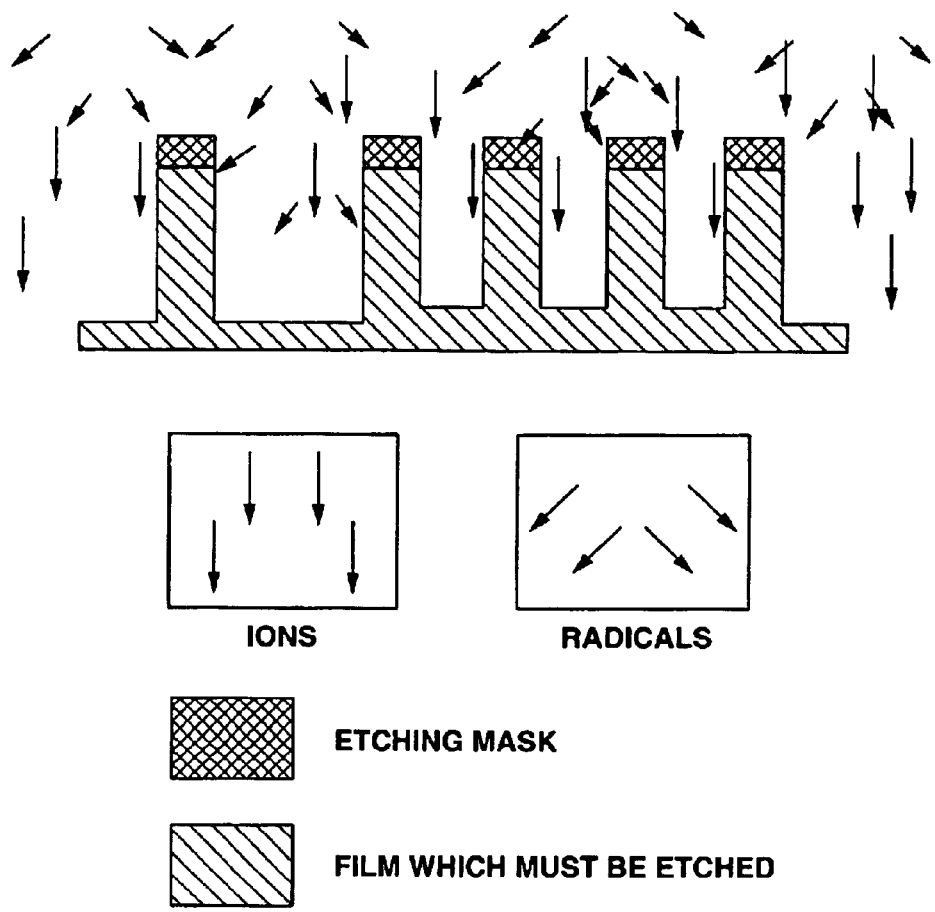
FIG. 3 is a schematic cross sectional view showing a state of a film, which must be etched, when radicals are contained in etching gas in a relatively small quantity with respect to the quantity of ions.
Figure 4:
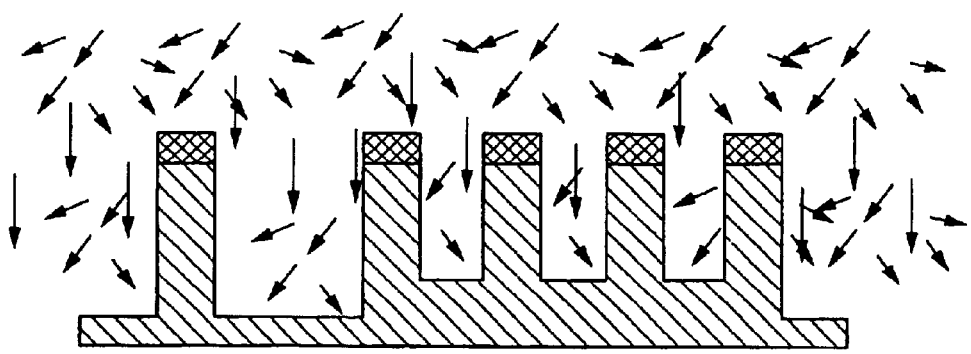
FIG. 4 is a schematic cross sectional view showing a state of a film, which must be etched, when radicals are contained in the etching gas in a relatively large quantity with respect to the quantity of ions.
Figure 5:
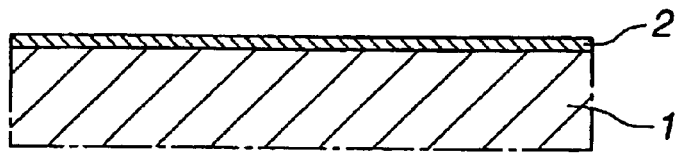
FIG. 5 is a schematic cross sectional view showing a state in which a gate insulating film has been formed on a silicon substrate by a method of manufacturing a semiconductor apparatus according to an embodiment of the present invention.

The process for manufacturing a MOS transistor according to the embodiment of the present invention, as shown in FIG. 5, has the step of performing heat treatment of the surface of a n- or p-type silicon substrate 1 to oxidize the surface so that a gate insulating film 2 is formed.

Figure 6:
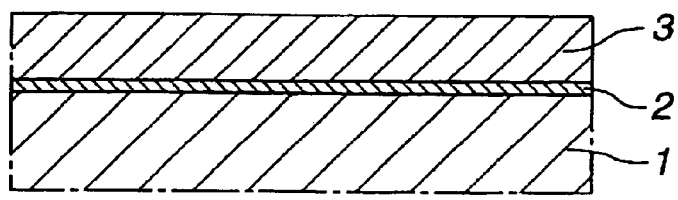
FIG. 6 is a schematic cross sectional view showing a state in which a polysilicon film has been formed on the gate insulating film shown in FIG. 5.

Then, as shown in FIG. 6, polysilicon is deposited on the overall surface of the silicon substrate 1 so that a polysilicon film 3 is formed. As an alternative to the polysilicon film 3 formed on the gate insulating film 2, an amorphous silicon film may be formed. In the foregoing case, heat treatment is performed in the following process to crystallize deposited amorphous silicon.

Figure 7:
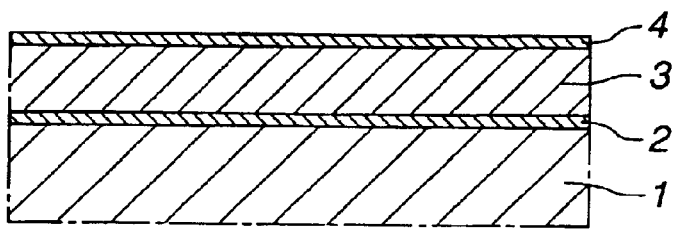
FIG. 7 is a schematic cross sectional view showing a state in which a reaction barrier film has been formed on the polysilicon film shown in FIG. 6.

Then, as shown in FIG. 7, tungsten nitride or titanium nitride is deposited on the polysilicon film 3 so that a reaction barrier film 4 is formed. The reaction barrier film 4 may be formed by, for example, a method with which the formed tungsten film or titanium film is subjected to heat treatment in a nitrogen atmosphere. Another method may be employed with which the formed tungsten film or the titanium film is subjected to plasma nitriding process or reactive ion sputtering.

Figure 8:
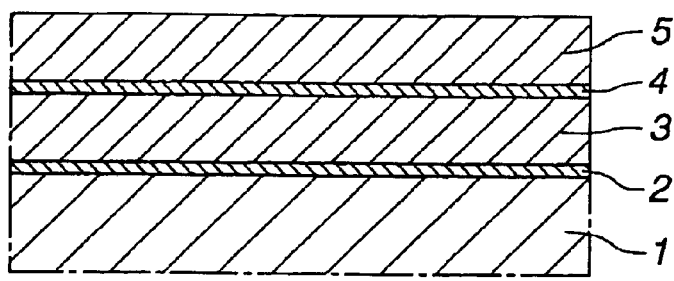
FIG. 8 is a schematic cross sectional view showing a state in which a tungsten film has been formed on the reaction barrier film shown in FIG. 7.

Then, as shown in FIG. 8, tungsten is deposited on the reaction barrier film 4 so that a tungsten film 5 is formed.

The formed polysilicon film 3, reaction barrier film 4 and tungsten film 5 are made of conductive materials which are patterned as described above so as to be formed into a gate electrode.

Tungsten has specific resistance which is lower than that of tungsten silicide, which has been widely used, by one order. Therefore, use of tungsten as the material of the gate electrode enables time required to transmit a signal in the semiconductor apparatus to considerably be shortened. Hence it follows that the degree of integration and operation speed of the semiconductor apparatus can be raised. Tungsten is allowed to react with polysilicon and formed into silicide owing to heat treatment which is performed at about 600° C., causing the resistance to be raised. Therefore, the reaction barrier film 4 serving as a barrier layer is formed between the polysilicon film 3 and the tungsten film 5. Since the reaction barrier film 4 serves as the barrier layer, the thickness of the reaction barrier film 4 is formed to have a small thickness with respect to the thickness of the tungsten film 5.

Figure 9:
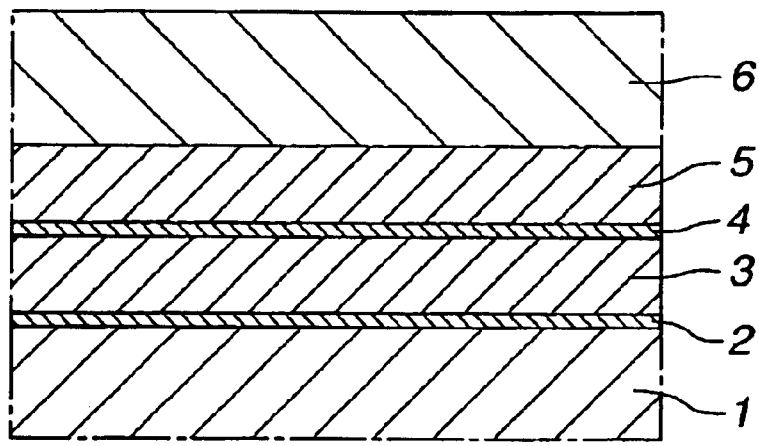
FIG. 9 is a schematic cross sectional view showing a state in which an offset film has been formed on the tungsten film shown in FIG. 8.

Then, as shown in FIG. 9, silicon nitride or silicon oxide is deposited on the tungsten film 5 so that an offset film 6 is formed.

Figure 10:
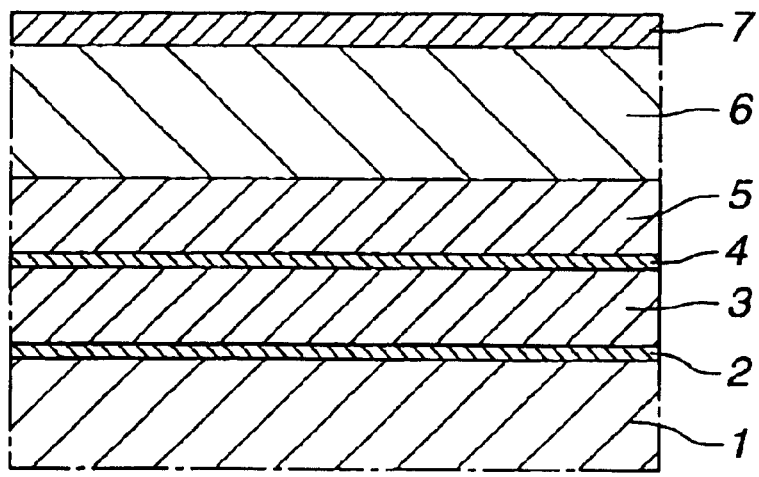
FIG. 10 is a schematic cross sectional view showing a state in which a reflection preventive film has been formed on the offset film shown in FIG. 9.

Then, as shown in FIG. 10, silicon nitride ($Si_3N_4$) is deposited to form a reflection preventive film 7 so as to obtain a high resolution in photolithography.

Figure 11:
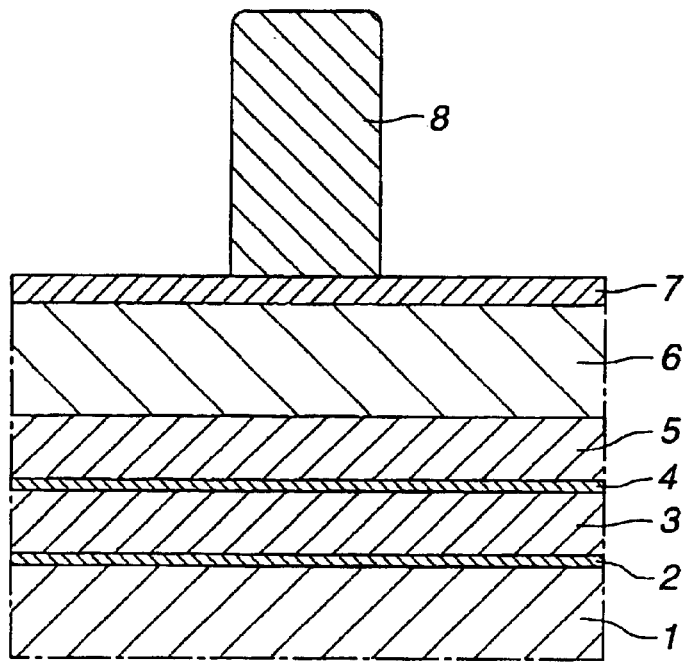
FIG. 11 is a schematic cross sectional view showing a state in which a photoresist has been patterned on the reflection preventive film shown in FIG. 10.

Then, as shown in FIG. 11, a photolithographic process and a development process are performed to pattern the photoresist 8.

Figure 12:
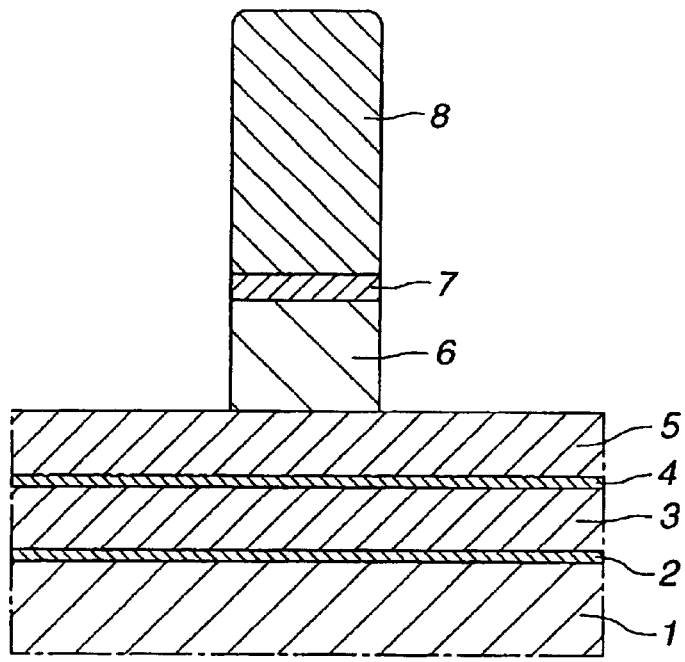
FIG. 12 is a schematic cross sectional view showing a state in which the offset film and the reflection preventive film shown in FIG. 11 have been etched.

Then, as shown in FIG. 12, the photoresist 8 is used as a mask to dry-etch the reflection preventive film 7 and the offset film 6.

Figure 13:
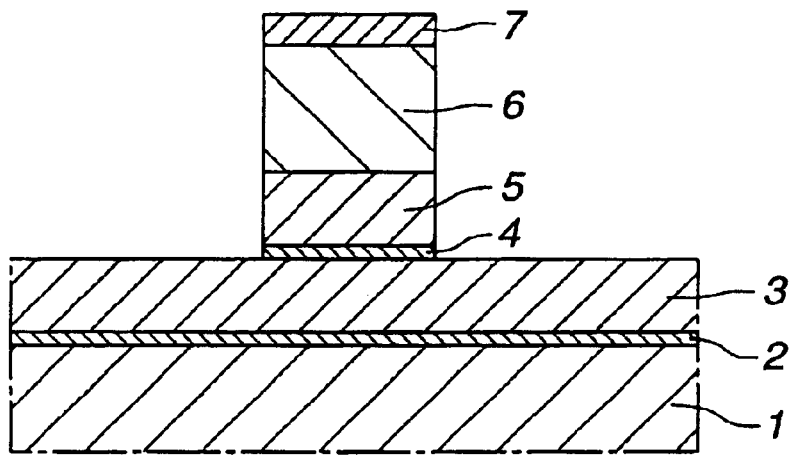
FIG. 13 is a schematic cross sectional view showing a state in which the tungsten film shown in FIG. 12 has been etched.

Then, as shown in FIG. 13, the patterned reflection preventive film 7 and offset film 6 are used as a mask to dry-etch the tungsten film 5 and the reaction barrier film 4.

Etching gas which is employed in the dry etching process is the mixed gas containing the fluorine gas, the gas of chlorine or hydrogen bromide, oxygen and nitrogen.

The functions of the gases contained in the mixed gas which are performed when the tungsten film 5 is etched will now be described. p The fluorine gas has a structure that the ratio of fluorine atoms with respect to elements of the gas molecule except for fluorine is four or less. When the composition of the fluorine molecule is $M_XF_Y$, fluorine gas having a ratio Y/X of four or less is employed, where M is an element except for fluorine atom and F is fluorine. Specifically, fluorine gas is employed which has a structure that the total number of fluorine atoms in elements which constitute the gas molecule, such as $CF_4$, $CHF_3$, $CH_2F_2$ or $CHF_3$, is four or less. The fluorine gas containing fluorine atoms at a ratio of four or less realizes an etching rate slower than that realized by higher-order fluorine gas, such as sulphur hexafluoride. Therefore, a practical etching rate with respect to a tungsten film 5 can be realized. The fluorine gas containing fluorine atoms at the ratio of four or less generates fluorine radicals in a quantity which is relatively smaller than fluorine ions. Therefore, the influence of the microloading effect can be reduced.

The foregoing mixed gas contains either or the chlorine gas or bromine gas. Chlorine gas forms oxy halide ($WO_XCl_Y$) of tungsten in association with oxygen to enhance etching of the tungsten film 5. Similarly, bromine forms oxy halide ($WO_XBr_Y$) in association with oxygen to enhance etching of tungsten.

Nitrogen nitrides side walls of the tungsten film 5 and the like to form tungsten nitride to prevent progress of etching in a region in which hairlines are isolated from one another. Therefore, nitrogen makes the etching rate in a region in which hairlines are formed densely and that in a region in which hairlines are isolated from one another to be uniform.

Since the mixed contains the fluorine gas, the gas of chlorine or hydrogen bromide, oxygen and nitrogen, the microloading effect can be prevented. Moreover, the tungsten film 5 can be etched at practical rate.

Figure 14:
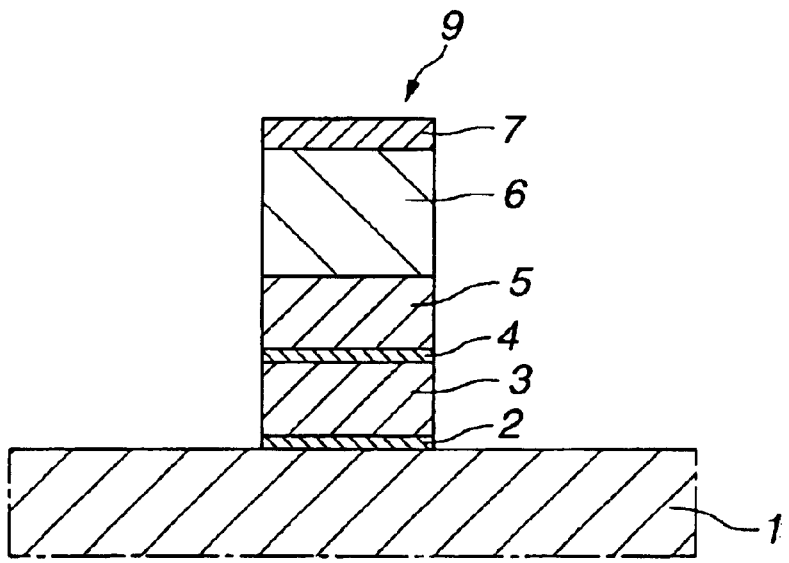
FIG. 14 is a schematic cross sectional view showing a state in which the polysilicon film shown in FIG. 13 has been etched.

Then, as shown in FIG. 14, the apparatus with which the tungsten film 5 and the reaction barrier film 4 have been dry-etched is operated to continuously dry-etch the polysilicon film 3 with etching gas which does not contain fluorine. The process for dry-etching the polysilicon film 3 is performed by successively carrying out removal of a naturally-formed oxide film on the polysilicon film 3, removal of residues of tungsten nitride, etching of the polysilicon film 3 and overetching of the polysilicon film 3.

As described above, the tungsten film 5, the reaction barrier film 4 and the polysilicon film 3 are dry-etched so that a gate electrode 9 is formed on the silicon substrate 1. Then, implantation of ions of low-density impurities into regions in each of which impurities are diffused, formation of a side wall, implantation of high-density impurities into regions in each of which impurities are diffused, diffusion of the impurities and formation of an interlayer insulating film are performed so that the MOS transistor is manufactured.

As described above, the process for manufacturing a MOS transistor according to the embodiment of the present invention is structured such that a polymetal gate containing tungsten as the gate electrode is employed. Thus, a MOS transistor exhibiting a high operation speed and a fine structure can be manufactured.

The process for manufacturing a MOS transistor according to the embodiment of the present invention is structured such that the mixed gas containing the fluorine gas, gas of either of chlorine or hydrogen bromide, oxygen and nitrogen is employed to prevent the microloading effect. Moreover, tungsten for forming the gate electrode is etched at a practical rate. Hence it follows that the manufacturing process according to the present invention is able to prevent an adverse influence caused from the microloading effect. Therefore, the shape of the gate electrode 9 can be controlled without any dependency on the difference in the pattern in the same chip. The manufacturing process according to the present invention is performed such that the tungsten film 5 and the reaction barrier film 4 composed of tungsten nitride or titanium nitride are etched at practical rate. Therefore, the etched surface of the gate electrode 9 can be flattened. Thus, physical damage of the gate insulating film 2 and so forth formed lower than the gate electrode 9 can be prevented. As a result, the tungsten film 5 and the reaction barrier film 4 can successively be etched.

EXAMPLES

Examples of the process for manufacturing a MOS transistor having the structure that the gate electrode is the polymetal gate will now be described.

First Example

A first example of the process for manufacturing a MOS transistor incorporating the gate electrode which was the polymetal gate will now be described. The first example was structured such that an ECR (Electron Cycloton Resonance) reactive ion-flow etching apparatus was employed to etch the reaction barrier film 4 and the tungsten film 5. Moreover, the fluorine gas was $CF_4$.

Initially, a gate insulating film 2 having a thickness of 2.5 nm was formed on. a silicon substrate 1. Then, a LPCVD apparatus was operated so that a polysilicon film 3 having a thickness of 100 nm was formed on the overall surface of the silicon substrate 1. Then, a sputtering apparatus was operated so that a tungsten film having a thickness of 5 nm was formed on the polysilicon film 3. Then, the tungsten film having the thickness of 5 nm was annealed at 850° C. for 10 minutes in a nitrogen atmosphere so that a reaction barrier film 4 made of tungsten nitride was formed. Then, a sputtering apparatus was operated so that a tungsten film 5 having a thickness of 100 nm was formed on the reaction barrier film 4.

Then, the LPCVD apparatus was operated so that a silicon nitride film having a thickness of 150 nm and serving as an offset film 6 was formed on the tungsten film 5. Then, a plasma CVD apparatus was operated so that a reflection preventive film 7 having a thickness of 30 nm and made of silicon nitrogen oxide (SiON) was formed on the offset film 6.

Then, an excimer laser stepper was operated to pattern a photoresist 8 on the reflection preventive film 7.

Then, the photoresist 8 was used to serve as a mask to dry-etch the offset film 6 made of silicon nitride and the reflection preventive film 7 made of silicon nitrogen oxide (SiON) by an apparatus arranged to etch an oxide film and formed into a parallel flat shape having a narrow gap. The etching operation was performed under the following conditions.

Conditions Under which Offset Film 6 and Reflection Preventive Film 7 were Dry-Etched

| | |
|---|---|
| Pressure | : 130 Pa |
| RF Electric Power | : 1000 W (13.56 MHz) |
| Flow Rate of Gas | : $CF_4$ (95 ml/min) |
| | : Ar (950 ml/min) |
| Temperature of Electrode | : 40° C. |

Then, the patterned offset film 6 was used as a mask to dry-etch the tungsten film 5 and the reaction barrier film 4 by an ECR reactive ion flow etching apparatus. The ECR reactive ion flow etching apparatus is an apparatus incorporating an ion source with which a plasma flow is dispersed to etch a substrate placed in the plasma flow. The etching operation was performed under the following conditions.

Conditions Under which Tungsten Film 5 and Reaction Barrier Film 4 were Dry-Etched

| | |
|---|---|
| Pressure | : 0.3 Pa |
| Electric Power of Microwaves | : 800 W (2.45 GHz) |
| RF Electric Power of Wafer Electric Power | : 50 W (400 kHz) |
| Flow Rate of Gas | : $Cl_2$ (15 ml/min) |
| | : $CF_4$ (30 ml/min) |
| | : $N_2$ (10 ml/min) |
| | : $O_2$ (20 ml/min) |
| Temperature of Electrode | : 30° C. |

Then, the ECR reactive ion flow etching apparatus with which the reaction barrier film 4 and the tungsten film 5 were etched was operated so that the polysilicon film 3 was continuously dry-etched and the gate electrode 9 was patterned. The etching operation was performed under the following conditions.

Conditions Under which Naturally-Oxidized Film on Polysilicon Film 3 was Removed and Residues of Tungsten Nitride were Removed

| | |
|---|---|
| Pressure | : 0.5 Pa |
| Electric Power of Microwave | : 400 W (245 GHz) |
| RF Electric Power of Wafer Electric Power | : 50 W (400 kHz) |
| Flow Rate of Gas | : $Cl_2$ (120 ml/min) |
| Temperature of Electrode | : 40° C. |
| Duration of Etching | : 10 seconds |

Conditions Under which Polysilicon Film 3 was Etched

| | |
|---|---|
| Pressure | : 0.5 Pa |
| Electric Power of Microwave | : 400 W (2.45 GHz) |
| RF Electric Power of Wafer Electric Power | : 25 W (400 kHz) |
| Flow Rate of Gas | : $Cl_2$ (15 ml/min) |
| | : HBr (95 ml/min) |
| | : $O_2$ (5ml/min) |
| Temperature of Electrode | : 40° C. |

Note that the duration of etching was determined by automatically detecting a final point by measuring the wavelength of emitted light of $SiCl_2$.

Overetching Conditions for Polysilicon Film 3

| | |
|---|---|
| Pressure | : 0.5 Pa |
| Electric Power of Microwave | : 400 W (2.45 GHz) |
| RF Electric Power of Wafer Electric Power | : 20 W (400 kHz) |
| Flow Rate of Gas | : HBr (100 ml/min) |
| Flow Rate of Gas | : $O_2$ (10 ml/min) |
| Temperature of Electrode | : 40° C. |
| Duration of Etching | : 20 seconds |

Then, a process for etching the polysilicon film 3 was performed, and then implantation of ions of low-density impurities into regions in each of which impurities are diffused, formation of a side wall, implantation of high-density impurities into regions in each of which impurities are diffused, diffusion of the impurities and formation of an interlayer insulating film were performed so that the MOS transistor was manufactured.

The thus-performed first example enabled the gate electrode composed of the offset film 6 made of silicon nitride, the tungsten film 5, the reaction barrier film 4 made of tungsten nitride and the polysilicon film 3 to be formed into an anisotropic shape.

Second Example

A second example of the process for manufacturing a MOS transistor incorporating the gate electrode which was polymetal gate will now be described. In the second example, the reaction barrier film 4 and the tungsten film 5 were etched by an inductively coupled plasma (ICP) etching apparatus. The fluorine gas according to this example was $CHF_3$.

In the second example, the same process as that according to the first example was performed until the offset film 6 made of silicon nitride and the reflection preventive film 7 made of silicon nitrogen oxide (SiON) were dry-etched by the apparatus arranged to etch an oxide film and having a parallel flat plate shape having a narrow gap.

Then, the patterned offset film 6 was used to serve as a mask to dry-etch the tungsten film 5 and the reaction barrier film 4 by the inductively coupled plasma (ICP) etching apparatus.

Conditions Under which Tungsten Film 5 and Reaction Barrier Film 4 were Dry-Etched

| | |
|---|---|
| Pressure | : 0.4 Pa |
| RF Electric Power of ICP | : 600 W (12.56 MHz) |
| RF Electric Power of Wafer Electric Power | : 80 W (13.56 MHz) |
| Flow Rate of Gas | : $Cl_2$ (60 ml/min) |
| | : $CHF_3$ (15 ml/min) |
| | : $N_2$ (10 ml/min) |
| | : $O_2$ (10 ml/min) |
| Temperature of Electrode | : 40° C. |

Then, the ICP etching apparatus with which the reaction barrier film 4 and the tungsten film 5 were etched was operated so that the polysilicon film 3 was continuously dry-etched so that the gate electrode 9 was patterned. The etching operation was performed under the following conditions:

Conditions Under which Naturally-oxidized Film was Removed and Residues of Tungsten Nitride were Removed

| | |
|---|---|
| Pressure | : 0.4 Pa |
| RF Electric Power of ICP | : 500 W (13.56 MHz) |
| RF Electric Power of Wafer Electric Power | : 100 W (12.56 MHz) |
| Flow Rate of Gas | : $Cl_2$ (100 ml/min) |
| Temperature of Electrode | : 40° C. |
| Duration of Etching | : 10 seconds |

Conditions Under which Polysilicon Film 3 was Etched

| | |
|---|---|
| Pressure | : 6.5 Pa |
| RF Electric Power of ICP | : 600 W (13.56 MHz) |
| RF Electric Power of Wafer Electric Power | : 120 W (12.56 MHz) |
| Flow Rate of Gas | : HBr (120 ml/min) |
| | : $O_2$ (3 ml/min) |
| Temperature of Electrode | : 40° C. |

Note that the duration of etching was determined by automatically detecting a final point by measuring the wavelength of emitted light of $SiCl_2$.

Overetching Conditions for Polysilicon Film 3

| | |
|---|---|
| Pressure | : 6.5 Pa |
| RF Electric Power of ICP | : 600 W (13.56 MHz) |
| RF Electric Power of Wafer Electric Power | : 100 W (12.56 MHz) |
| Flow Rate of Gas | : HBr (120 ml/min) |
| | : $O_2$ (5 ml/min) |
| Temperature of Electrode | : 40° C. |
| Duration of Etching | : 30 seconds |

Then, a process for etching the polysilicon film 3 was performed, and then implantation of ions of low-density impurities into regions in each of which impurities are diffused, formation of a side wall, implantation of high-density impurities into regions in each of which impurities are diffused, diffusion of the impurities and formation of an interlayer insulating film were performed so that the MOS transistor was manufactured.

The thus-performed second example enabled the gale electrode composed of the offset film 6 made of silicon nitride, the tungsten film 5, the reaction barrier film 4 made of tungsten nitride and the polysilicon film 3 to be formed into an anisotropic shape.

Third Example

A third example of the process for manufacturing a MOS transistor incorporating the gate electrode which was polymetal gate will now be described. In the third example, the reaction barrier film 4 and the tungsten film 5 were etched by an inductively coupled plasma (ICP) etching apparatus. The fluorine gas according to this example was $CH_2F_2$.

In the third example, the same process as that according to the first and second examples was performed until the offset film 6 made of silicon nitride and the reflection preventive film 7 made of silicon nitrogen oxide (SiON) were dry-etched by the apparatus arranged to etch an oxide film and having a parallel flat plate shape having a narrow gap.

Then, the patterned offset film 6 was used to serve as a mask to dry-etch the tungsten film 5 and the reaction barrier film 4 by the inductively coupled plasma (ICP) etching apparatus. The dry etching operation was performed under the following conditions.

Conditions Under which Tungsten film 5 and Reaction Barrier Film 4 were Dry-Etched

| | |
|---|---|
| Pressure | : 0.4 Pa |
| RF Electric Power of ICP | : 600 W (12.56 MHz) |
| RF Electric Power of Wafer Electric Power | : 90 W (13.56 MHz) |
| Flow Rate of Gas | : $Cl_2$ (80 ml/min) |
| | : $CH_2F_2$ (20 ml/min) |
| | : $N_2$ (5 ml/min) |
| | : $O_2$ (5 ml/min) |
| Temperature of Electrode | : 40° C. |

The ICP etching apparatus with which the reaction barrier film 4 and the tungsten film 5 were etched was operated to continuously dry-etch the polysilicon film 3 and pattern the gate electrode 9. The etching operation was performed as follows.

Conditions Under which Removal of Naturally-Oxidized Film on Polysilicon Film 3 and that of Residues of Tungsten Nitride were Performed

| | |
|---|---|
| Pressure | : 0.4 Pa |
| RF Electric Power of ICP | : 500 W (13.56 MHz) |
| Electric Power of Wafer Electric Power | : 100 W (12.56 MHz) |
| Flow Rate of Gas | : Cl$_2$ (100 ml/min) |
| Temperature of Electrode | : 40° C. |
| Duration of Etching | : 10 seconds |

Conditions under which Polysilicon film 3 was Etched

| | |
|---|---|
| Pressure | : 6.5 Pa |
| RF Electric Power of ICP | : 600 W (13.56 MHz) |
| RF Electric Power of Wafer Electric Power | : 120 W (12.56 MHz) |
| Flow Rate of Gas | : HBr (120 ml/min) |
| | : O$_2$ (3 ml/min) |
| Temperature of Electrode | : 40° C. |

Note that the duration of etching was determined by automatically detecting a final point by measuring the wavelength of emitted light of SiCl$_2$.

Overetching Conditions for Polysilicon Film 3

| | |
|---|---|
| Pressure | : 6.5 Pa |
| RF Electric Power of ICP | : 600 W (13.56 MHz) |
| RF Electric Power of Wafer Electric Power | : 100 W (12.56 MHz) |
| Flow Rate of Gas | : HBr (120 ml/min) |
| | : O$_2$ (5 ml/min) |
| Temperature of Electrode | : 40° C. |
| Duration of Etching | : 30 seconds |

Then, a process for etching the polysilicon film 3 was performed, and then implantation of ions of low-density impurities into regions in each of which impurities are diffused, formation of a side wall, implantation of high-density impurities into regions in each of which impurities are diffused, diffusion of the impurities and formation of an interlayer insulating film were performed so that the MOS transistor was manufactured.

The thus-performed third example enabled the gate electrode composed of the offset film 6 made of silicon nitride, the tungsten film 5, the reaction barrier film 4 made of tungsten nitride and the polysilicon film 3 to be formed into an anisotropic shape.

As described above, the etching method according to the present invention is structured such that the mixed gas containing the fluorine gas, the gas of either of chlorine or hydrogen bromide, oxygen and nitrogen is used. Thus, the microloading effect can be prevented. Moreover, tungsten can be etched at practical speed. As a result, the etching method according to the present invention which is capable of preventing an adverse influence of the microloading effect is able to control the shape of tungsten without any dependency on the shape of the pattern which must be processed. The etching method according to the present invention, which is capable of etching tungsten at practical speed, is able to flatten the etched surface of tungsten. Therefore, any adverse influence is not exerted on the characteristics of the materials below the tungsten layer.

The method of manufacturing a semiconductor apparatus according to the present invention is arranged such that the mixed gas containing the fluorine gas, the gas of either of chlorine or hydrogen bromide, oxygen and nitrogen is used. Thus, the microloading effect can be prevented and tungsten which serves as the gate electrode can be etched at practical speed. Thus, the method of manufacturing the semiconductor apparatus according to the present invention is able to lower the resistance of the gate electrode. Therefore, electric power required of transistors can be reduced and the operation speed can be raised. The method of manufacturing a semiconductor apparatus according to the present invention, which is capable of preventing an influence of the microloading effect, is able to control the shape of the gate electrode without any dependency of the difference in the pattern in the same chip. The method of manufacturing a semiconductor apparatus according to the present invention is structured such that tungsten and tungsten nitride or titanium nitride are etched at practical speed. Thus, the etched surface of the gate electrode can be flattened. As a result, damage of the gate insulating film and the like formed below the gate electrode can be prevented. Thus, tungsten and polycrystal silicon or amorphous silicon can continuously be etched.

Although the invention has been described in its preferred form and structure with a certain degree of particularity, it is understood that the present disclosure of the preferred form can be changed in the details of construction and in the combination and arrangement of parts without departing from the spirit and the scope of the invention as hereinafter claimed.

What is claimed is:

1. A dry etching method comprising the step of:
   dry-etching a formed film of tungsten through its entire thickness as originally formed using only a single mixed gas including a fluorine-containing gas that includes a compound having fluorine and carbon in a molecule, chlorine or hydrogen bromide, oxygen, and nitrogen,
   wherein said fluorine-containing gas has a structure that a ratio of fluorine atoms with respect to elements of the gas molecule except for fluorine is four or less when the composition of the fluorine molecule is $M_XF_Y$, $Y/X \leq 4$ where M is an element except for fluorine atom and F is fluorine, and the total number of fluorine atoms in elements constituting said gas molecule is four or less.

2. A method of manufacturing a semiconductor apparatus comprising the steps of:
   laminating upwards a polycrystal silicon film or an amorphous silicon film, a tungsten nitride film or a titanium nitride film, and a tungsten film on a silicon substrate; and
   performing a dry-etching of said tungsten nitride film through its entire thickness as originally formed, or said titanium nitride film and said tungsten film through its entire thickness as originally formed, with only a single mixed gas containing fluorine-containing gas that includes a compound having fluorine and carbon in a molecule, chlorine or hydrogen bromide, oxygen and nitrogen so that a gate electrode is formed,
   wherein said fluorine-containing gas has a structure that a ratio of fluorine atoms with respect to elements of the gas molecule except for fluorine is four or less when the composition of the fluorine molecule is $M_XF_Y$, $Y/X \leq 4$ where M is an element except for fluorine atom and F is fluorine, and the total number of fluorine atoms in elements constituting said gas molecule is four or less.

3. A method of manufacturing a semiconductor apparatus according to claim 2, wherein said gate electrode is formed by dry-etching said polycrystal silicon film or said amorphous silicon film with gas which does not contain fluorine.

4. A method of manufacturing a semiconductor apparatus according to claim 2, wherein a mask is formed by silicon oxide or silicon nitride, and said gate electrode is formed by dry etching using said mask.

* * * * *